United States Patent [19]

Yap

[11] Patent Number: 5,097,142
[45] Date of Patent: Mar. 17, 1992

[54] BALANCING NETWORK FOR PARALLEL CONNECTED TRANSISTORS

[75] Inventor: Choon M. Yap, Taman Jurong, Singapore

[73] Assignee: Motorola, Inc., Schaumburg, Ill.

[21] Appl. No.: 628,540

[22] Filed: Dec. 17, 1990

[51] Int. Cl.⁵ .................... H03K 17/60; H03K 17/56
[52] U.S. Cl. .................... 307/254; 307/242; 307/296.1
[58] Field of Search .............. 307/254, 242, 296.1, 307/304; 323/268, 269, 272

[56] References Cited

U.S. PATENT DOCUMENTS

| | | | |
|---|---|---|---|
| 3,381,145 | 4/1968 | Sterff | 307/254 |
| 4,207,478 | 6/1980 | Marumoto et al. | 307/254 X |
| 4,616,142 | 10/1986 | Upadhyay et al. | 307/254 X |
| 4,864,162 | 9/1989 | Maoz | 307/296.1 |

Primary Examiner—John S. Heyman
Assistant Examiner—Toan Tran
Attorney, Agent, or Firm—Daniel K. Nichols

[57] ABSTRACT

In conjunction with parallel connected transistors, a balancing network including a load-current sensing resistance in the emitter/collector path of each transistor and a shunt resistance connected between the sensing resistor and the base to control base current and a ring network of resistances connected to the bases to force equal distribution of base current.

4 Claims, 1 Drawing Sheet

BALANCING NETWORK FOR PARALLEL CONNECTED TRANSISTORS

TECHNICAL FIELD

The present invention pertains to apparatus and methods for maintaining the current flowing through a plurality of parallel transistors substantially balanced and more specifically to a balancing network connected to a plurality of parallel transistors to maintain the transistors substantially balanced.

BACKGROUND OF THE INVENTION

Generally, single transistors are not capable of delivering high power for output circuits and the like. Therefore, it is common to utilize a plurality of transistors in parallel for circuits requiring more power than single transistors can deliver. Also, connecting a plurality of transistors in parallel should reduce the amount that any one of the transistors conducts and, thus, should reduce the heat produced by individual transistors.

The problem is that the individual transistors and the accompanying circuits are not always evenly balanced. If one of the transistors in the plurality of parallel transistors starts to conduct more current for any reason, it will begin to heat more than the other transistors. It can be shown that the beta, or amount of conduction, of a transistor is dependent upon the heat of the transistor. Thus, as the transistor conducts more the temperature rises, which causes it to conduct more, and the conduction continues to spiral upward until one transistor is carrying all of the load and the others have virtually shut off.

This phenomenon is reduced in prior art devices by mounting the transistors on heat sinks, such as a chassis, to maintain the heat constant. There are several problems with this prior art solution. Mounting transistors on a chassis, for example, produces much vibration in the leads to the transistors, thereby causing lead breakage and a large number of failures. Further, it is difficult to mount the transistors on heat sinks, chassis and the like and requires many additional assembly steps which are costly and inefficient.

SUMMARY OF THE INVENTION

It is an object of the present invention to provide new and improved operation of parallel connected transistors.

It is a further object of the present invention to provide new and improved operation of parallel connected transistors which reduces failures due to over conduction and lead breakage and which simplifies the mounting and assembly of the transistors.

These and other objects are realized in a balancing network for a plurality of parallel connected transistors, each having first and second load-current carrying electrodes and a control electrode, the balancing network including a DC bias resistance connected between each adjacent pair of control electrodes to form a ring network, which forces the base electrodes to a predetermined potential.

These and other objects are further realized in a balancing network for a plurality of parallel connected transistors, each having first and second load-current carrying electrodes and a control electrode, said balancing network including a DC bias resistance connected between each adjacent pair of control electrodes to form a ring network and a shunt bias resistance connected between the first load-current carrying electrodes and the control electrode for each of the plurality of parallel connected transistors, which shunt bias resistance provides a negative feedback to the base electrode of each transistor to prevent spiralling conduction.

The objects may be further realized in a method of controlling the plurality of transistors to supply substantially balanced current including the steps of developing a load-current bias signal for each of the plurality of transistors and supplying the load-current bias signal to the control electrode of each transistor to maintain the conduction of each transistor relatively constant (nonspiralling), supplying a bias potential to the control electrode of each transistor, and forcing the bias potential to substantially a predetermined value.

BRIEF DESCRIPTION OF THE DRAWING

The single FIGURE illustrates a schematic diagram of a plurality of parallel connected transistors with a balancing network attached thereto embodying the present invention.

DESCRIPTION OF THE PREFERRED EMBODIMENT

Figure 1:
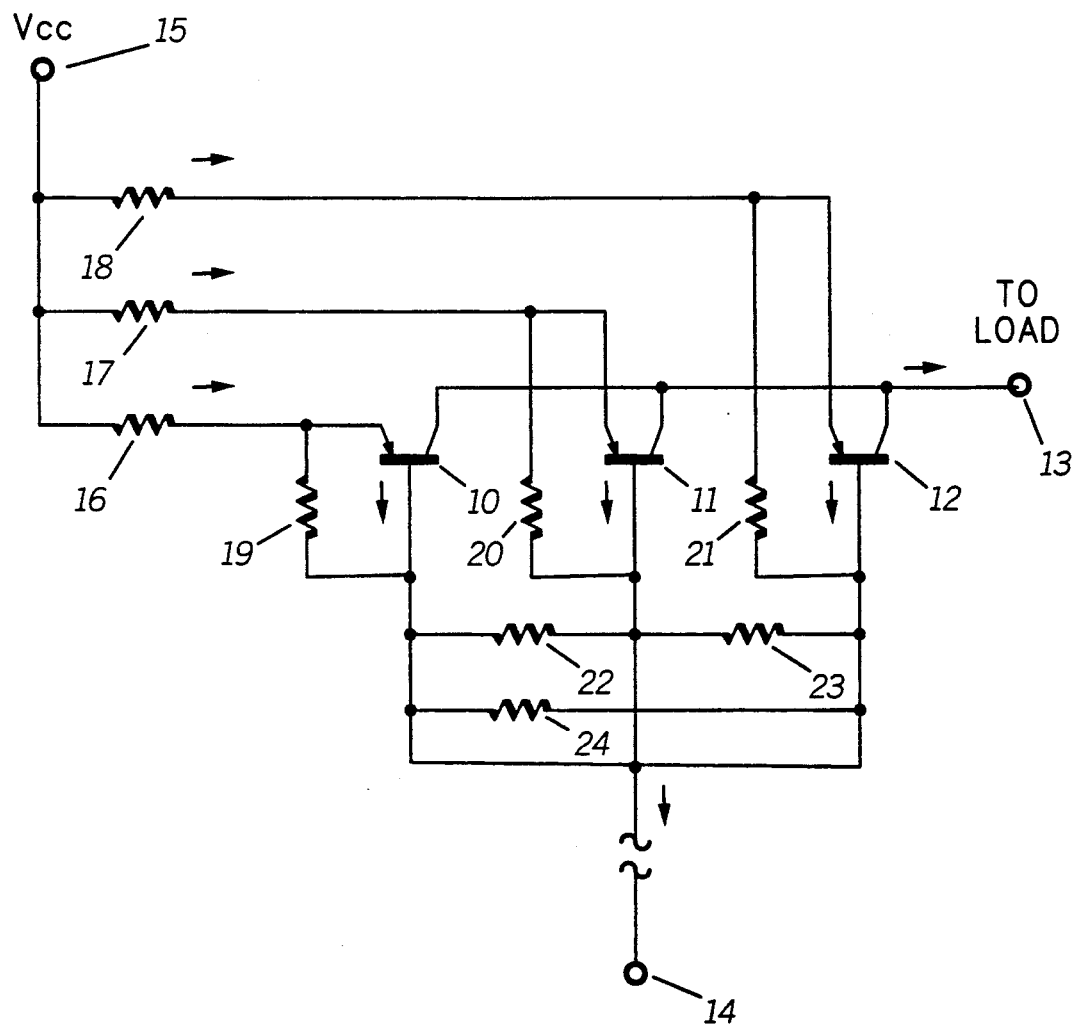

Referring specifically to the single FIGURE, a plurality of transistors 10, 11 and 12 are illustrated schematically. Each transistor 10, 11 and 12 has a pair of load-current carrying electrodes, in this embodiment an emitter and a collector, and a control electrode, which in this embodiment is a base. While the three transistors are illustrated as P-N-P type transistors for convenience, it will be understood by those skilled in the art that N-P-N type transistors could easily be utilized by simply reversing the load-current carrying electrodes. Also, it is anticipated that other types of transistors might be utilized in accordance with the present teachings.

The plurality of transistors 10, 11 and 12 are connected in parallel and to a balancing network in the following manner. The collector electrode of each of the transistors 10, 11 and 12 is connected to a common output terminal 13. which is adapted to be connected to a load. The base electrode of each of the transistors 10, 11 and 12 is connected to a common control terminal 14. The emitter electrodes of the transistors 10, 11 and 12 are connected through load-current bias resistances to a terminal 15 adapted to have a power source, which in this embodiment is a potential Vcc, connected thereto. The load-current bias resistances are illustrated by resistors 16, 17 and 18 which are connected between terminal 15 and the emitters of transistors 10, 11 and 12, respectively. Resistors 19, 20 and 21, which are utilized to represent three shunt bias resistances, are connected from the emitter electrode to the base electrode of each of the transistors 10, 11 and 12, respectively. Three resistors 22, 23 and 24 are utilized to represent D.C. bias resistances, which are connected between the base electrodes of adjacent transistors to form a ring network. Resistor 22 is connected to the base electrode of transistor 10 at one end and to the base electrode of transistor 11 at the other end. Resistor 23 is connected to the base electrode of transistor 11 at one end and to the base electrode of transistor 12 at the other end. Resistor 24 is connected to the base electrode of transistor 10 at one end and to the base electrode of transistor 12 at the other end to complete the ring network.

In the operation of the described circuit, the load-current bias resistances (resistors 16, 17 and 18) and the shunt bias resistances (resistors 19, 20 and 21) cooperate to produce load-current bias signals and apply the signals to the base electrodes of transistors 10, 11 and 12. Resistors 16, 17 and 18 are in the emitter current (load current) path and each provide a potential which is a measure of the emitter current in each transistor 10, 11 and 12, respectively. This potential is fed back negatively from the emitter electrode to the base electrode of each transistor 10, 11 and 12 by the resistors 19, 20 and 21.

As an example, if transistor 10 begins to conduct more because of increased temperature, beta, which is dependent upon temperature, will increase due to the temperature change and the emitter current will increase. The increased emitter current will increase the voltage drop across resistor 16. The increase in voltage drop across resistor 16 will reduce the voltage drop across resistor 19, which is connected between the emitter and base electrodes of transistor 10 and is in parallel with the voltage Vbe (base to emitter forward bias voltage of the transistor). The following equation applies to the current flowing in the collector or emitter electrodes of the transistors 10, 11 and 12.

$$Ic = Ie = Is\{\exp.(qVbe/kT) - 1\}$$

where:
  Is = leakage current;
  q = electronic change $1.602 \times 10(-19)$ coulombs;
  T = temperature (k); and
  Vbe = forward bias voltage (volts) and has a negative temperature coefficient (tends to decrease with increase of temperature).

It can be seen from the above equation that emitter (and collector) currents are dependent upon temperature, as well as Vbe and leakage current. The reduction in voltage drop across resistor 19 reduces Vbe which reduces the drive to transistor 10. Since Vbe has a negative temperature coefficient it tends to reduce even further. Hence, the load-current bias signal developed by resistors 16 and 19 compensates for increases in beta due to temperature increases and vice versa for temperature decreases.

It should be understood by those skilled in the art that the various resistances described herein could be provided by a variety of different components. However, since the D.C. resistance value of the component provides the required bias, each resistance will, for convenience, simply be referred to hereinafter as the representative resistor previously described. The selection of resistors 16, 17 and 18 depends upon the degree of variations of the beta parameter for the transistors 10, 11 and 12. Also, the power rating of resistors 16, 17 and 18 depends upon the maximum emitter current and, if the power rating is chosen high, resistors 16, 17 and 18 behave as current limiting resistors that protect the transistors against any worst case over driving or short circuits. In the present embodiment, it was found that for a Vcc of 17 volts and a value of 680 ohms for resistors 19, 20 and 21, the optimum value for each of resistors 16, 17 and 18 is 22 ohms and 0.6 watts. If higher current drains are required the optimum resistance value could be reduced.

The ring network, including resistors 22, 23 and 24, ensures evenly distributed base electrode bias currents for each of transistors 10, 11 and 12. This is achieved by forcing the nodes (base electrodes) of the ring network to equal potential differences. As a result, each base electrode is forced to a predetermined potential which forces equal distribution of base currents. The value of resistors 22, 23 and 24 depends upon the degree of balance of the base currents. The larger the resistance value the more sensitive the ring network is to base current changes and, thereby the more balance of the base currents. In the present embodiment it was found that a resistance of 47 k ohms provided satisfactory balance for the transistors.

Thus, a new and improved balancing network for parallel connected transistors is disclosed which keeps the conduction of the transistors balanced and prevents the spiralling over conduction of one transistor. Further, the operation of the balancing network is not dependent upon temperature so that heat sinks and chassis mounting of the transistors can be eliminated. By eliminating chassis mounting of the transistors, lead breakage due to chassis vibration is eliminated. Also, assembly of the transistors into various circuits is greatly simplified, thereby reducing cost. In fact, it is anticipated that the entire assembly of parallel transistors and balancing network could be integrated into a single semiconductor chip.

While I have shown and described a specific embodiment of this invention, further modifications and improvements will occur to those skilled in the art. I desire it to be understood, therefore, that this invention is not limited to the particular forms shown and I intend in the append claims to cover all modifications that do not depart from the spirit and scope of this invention.

I claim:

1. A balancing network for a plurality of parallel connected transistors, each having first and second load-current carrying electrodes and a control electrode, said balancing network including a D.C. bias resistance connected between each adjacent pair of control electrodes whereby the D.C. bias resistances form a ring network, and a shunt bias resistance connected between one of the first and second load-current carrying electrodes and the control electrode for each of the plurality of parallel connected transistors.

2. A balancing network for a plurality of parallel connected transistors, each having first and second load-current carrying electrodes and a control electrode, said balancing network including a D.C. bias resistance connected between each adjacent pair of control electrodes whereby the D.C. bias resistances form a ring network, a shunt bias resistance connected between one of the first and second load-current carrying electrodes and the control electrode for each of the plurality of parallel connected transistors and a load-current bias resistance connected between a power source and one of the first and second load-current carrying electrodes to which the shunt bias resistance is connected for each of the plurality of parallel connected transistors.

3. A balancing network comprising:
  a plurality of transistors, each having first and second load-current carrying electrodes and a control electrode, said plurality of transistors being connected in parallel with the first load-current carrying electrode of each of said plurality being adapted to be connected to a power source, the second load-current carrying electrode of each of said plurality being adapted to be connected to a load and the control electrode of each of said plurality being adapted to have control current applied thereto:

a D.C. bias resistance connected between each adjacent pair of control electrodes whereby the D.C. bias resistances form a ring network; and a load-current bias resistance connected between the first load-current carrying electrode and the power source for each of said plurality of transistors and a shunt bias resistance connected between the first load-current carrying electrode and the control electrode for each of the plurality of transistors.

4. A balancing network as claimed in claim 3 wherein the plurality of transistors, the D.C. bias resistances and the load-current bias resistances are integrated into a single semiconductor circuit.

* * * * *